United States Patent
Lien et al.

(10) Patent No.: US 10,163,522 B2
(45) Date of Patent: Dec. 25, 2018

(54) TEST LINE LETTER FOR EMBEDDED NON-VOLATILE MEMORY TECHNOLOGY

(71) Applicant: Taiwan Semiconductor Manufacturing Co., Ltd., Hsun-Chu (TW)

(72) Inventors: Jui-Tsung Lien, Hsinchu (TW); Fang-Lan Chu, Taichung (TW); Hong-Da Lin, Taipei (TW); Wei Cheng Wu, Zhubei (TW); Ku-Ning Chang, Taichung (TW); Yu-Chen Wang, Huwei Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/883,787

(22) Filed: Oct. 15, 2015

(65) Prior Publication Data

US 2017/0110201 A1    Apr. 20, 2017

(51) Int. Cl.
*G02F 1/1333* (2006.01)
*H01L 23/544* (2006.01)
(Continued)

(52) U.S. Cl.
CPC ........ *G11C 29/025* (2013.01); *G01R 31/2884* (2013.01); *H01L 21/28282* (2013.01);
(Continued)

(58) Field of Classification Search
CPC ......... H01L 23/544; H01L 2223/54453; H01L 2223/54426; H01L 2924/00014; H01L 21/76229; H01L 2223/5442; H01L 2223/5446; H01L 2223/54406; H01L 2223/5448; H01L 2223/54493
See application file for complete search history.

(56) References Cited

U.S. PATENT DOCUMENTS

| 5,854,125 A | 12/1998 | Harvey |
| 6,210,999 B1 | 4/2001 | Gardner et al. |

(Continued)

FOREIGN PATENT DOCUMENTS

| CN | 104253113 A | 12/2014 |
| JP | 59011619 | 7/1982 |

(Continued)

OTHER PUBLICATIONS

U.S. Appl. No. 14/883,791, filed Oct. 15, 2015.
(Continued)

*Primary Examiner* — Bradley Smith
*Assistant Examiner* — David J Goodwin
(74) *Attorney, Agent, or Firm* — Eschweiler & Potashnik, LLC

(57) ABSTRACT

The present disclosure relates to a substrate having test line letters that are used to identify a test line on an integrated chip, while avoiding contamination of high-k metal gate processes, and a method of formation. In some embodiments, the substrate has a semiconductor substrate. A test line letter structure is arranged over the semiconductor substrate and has one or more trenches vertically extending between an upper surface of the test letter structure and a lower surface of the test line letter structure. The one or more trenches are arranged within the test line letter structure to form an opening in the upper surface of the test line structure that has a shape of an alpha-numeric character.

20 Claims, 11 Drawing Sheets

(51) Int. Cl.

| | | |
|---|---|---|
| *G11C 29/02* | (2006.01) | |
| *G01R 31/28* | (2006.01) | |
| *H01L 21/28* | (2006.01) | |
| *H01L 21/3213* | (2006.01) | |
| *H01L 21/768* | (2006.01) | |
| *H01L 23/528* | (2006.01) | |
| *H01L 27/11568* | (2017.01) | |
| *H01L 29/423* | (2006.01) | |
| *H01L 29/49* | (2006.01) | |
| *H01L 29/51* | (2006.01) | |
| *H01L 27/11526* | (2017.01) | |
| *H01L 27/11573* | (2017.01) | |
| *G11C 29/56* | (2006.01) | |
| *H01L 21/66* | (2006.01) | |

(52) U.S. Cl.
CPC .. *H01L 21/32133* (2013.01); *H01L 21/76802* (2013.01); *H01L 21/76877* (2013.01); *H01L 23/528* (2013.01); *H01L 23/544* (2013.01); *H01L 27/11568* (2013.01); *H01L 29/42344* (2013.01); *H01L 29/4916* (2013.01); *H01L 29/513* (2013.01); *G11C 2029/5602* (2013.01); *H01L 22/34* (2013.01); *H01L 27/11526* (2013.01); *H01L 27/11573* (2013.01); *H01L 2223/5446* (2013.01); *H01L 2223/54406* (2013.01); *H01L 2223/54453* (2013.01)

(56) References Cited

U.S. PATENT DOCUMENTS

| | | | |
|---|---|---|---|
| 6,891,216 B1 | 5/2005 | Huang et al. | |
| 7,679,202 B2 | 3/2010 | Yoshida et al. | |
| 2003/0109113 A1* | 6/2003 | Wen | H01L 23/544 438/401 |
| 2003/0141605 A1* | 7/2003 | Lee | H01L 23/544 257/797 |
| 2003/0203589 A1 | 10/2003 | Chung et al. | |
| 2004/0056993 A1* | 3/2004 | Kim | G02F 1/1333 349/110 |
| 2004/0140484 A1 | 7/2004 | Nelson | |
| 2004/0219751 A1* | 11/2004 | Satoh | H01L 27/11568 438/267 |
| 2005/0110012 A1 | 5/2005 | Lee et al. | |
| 2006/0022678 A1 | 2/2006 | Hegazy et al. | |
| 2007/0278564 A1* | 12/2007 | Ishii | H01L 21/28282 257/326 |
| 2008/0135986 A1* | 6/2008 | Moon | H01L 23/544 257/647 |
| 2009/0315193 A1 | 12/2009 | Ortner | |
| 2011/0284966 A1* | 11/2011 | Wen | H01L 21/823456 257/368 |
| 2014/0377889 A1 | 12/2014 | Chakihara et al. | |
| 2016/0124039 A1 | 5/2016 | Graetz et al. | |

FOREIGN PATENT DOCUMENTS

| | | |
|---|---|---|
| JP | 2004273962 | 9/2004 |
| JP | 2005241491 A | 9/2005 |

OTHER PUBLICATIONS

Non-Final Office Action dated Feb. 23, 2017 for U.S. Appl. No. 14/883,791.

Final Office Action dated Aug. 11, 2017 for U.S. Appl. No. 14/883,791.

Notice of Allowance dated Dec. 7, 2017 in connection with U.S. Appl. No. 14/883,791.

* cited by examiner

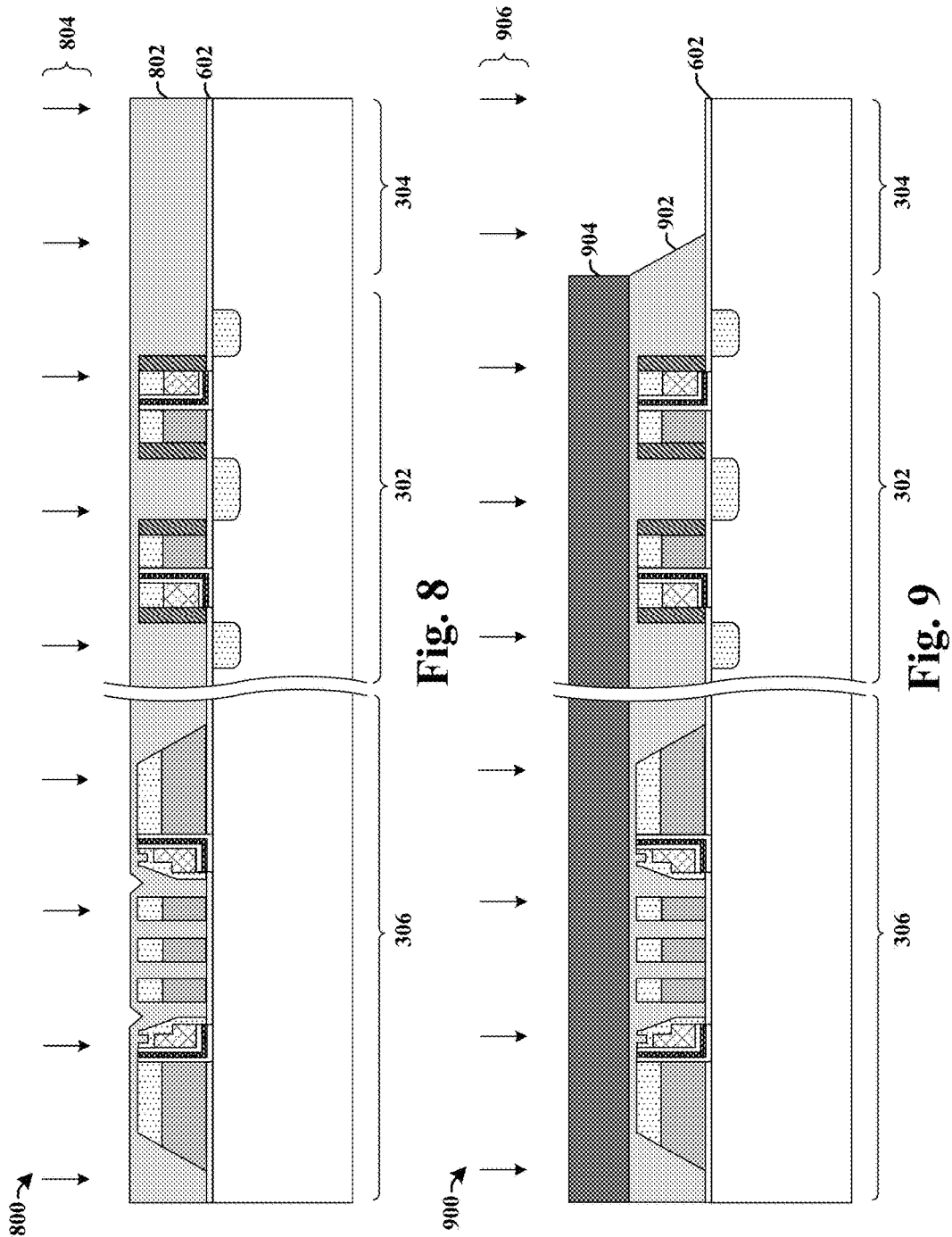

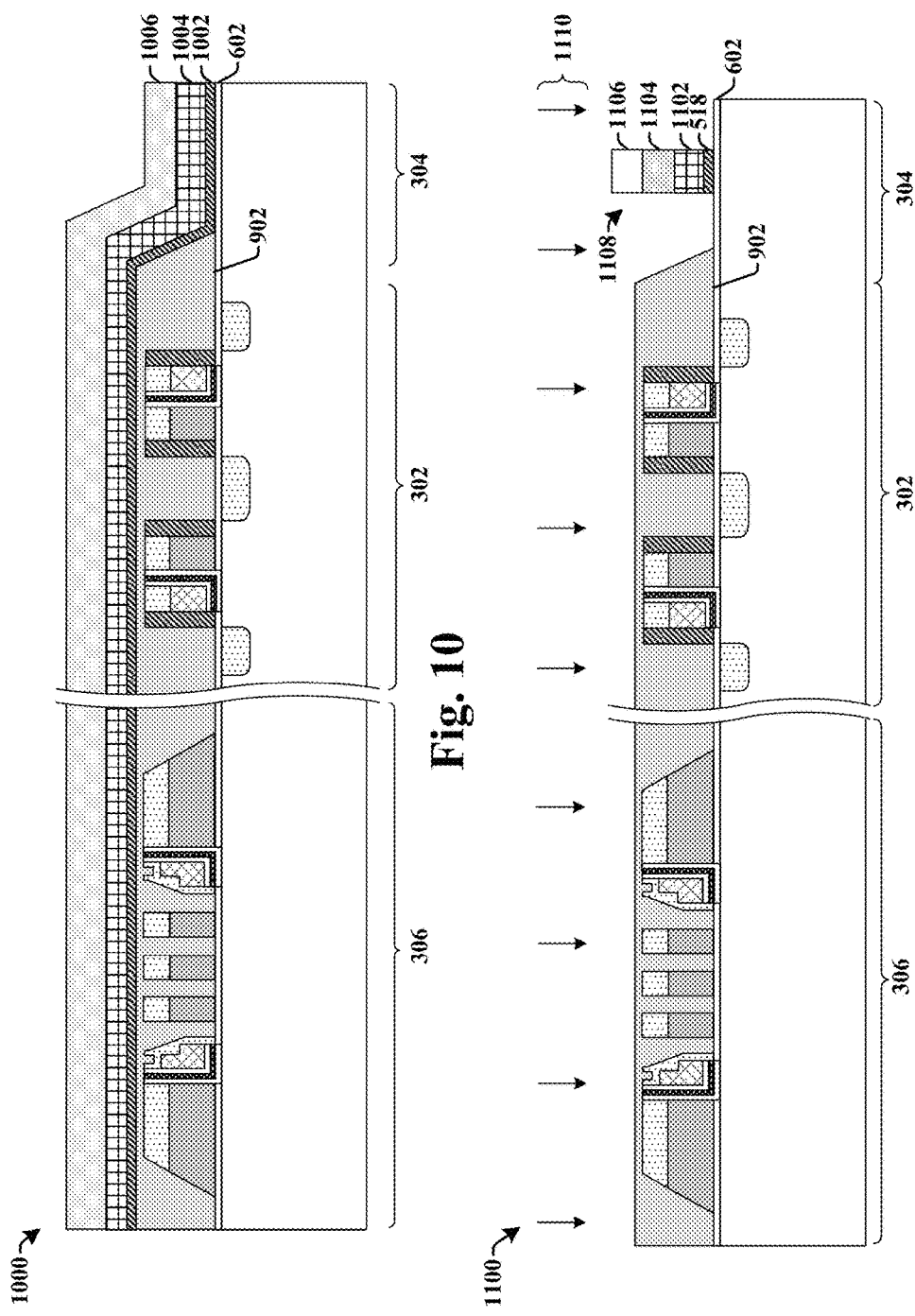

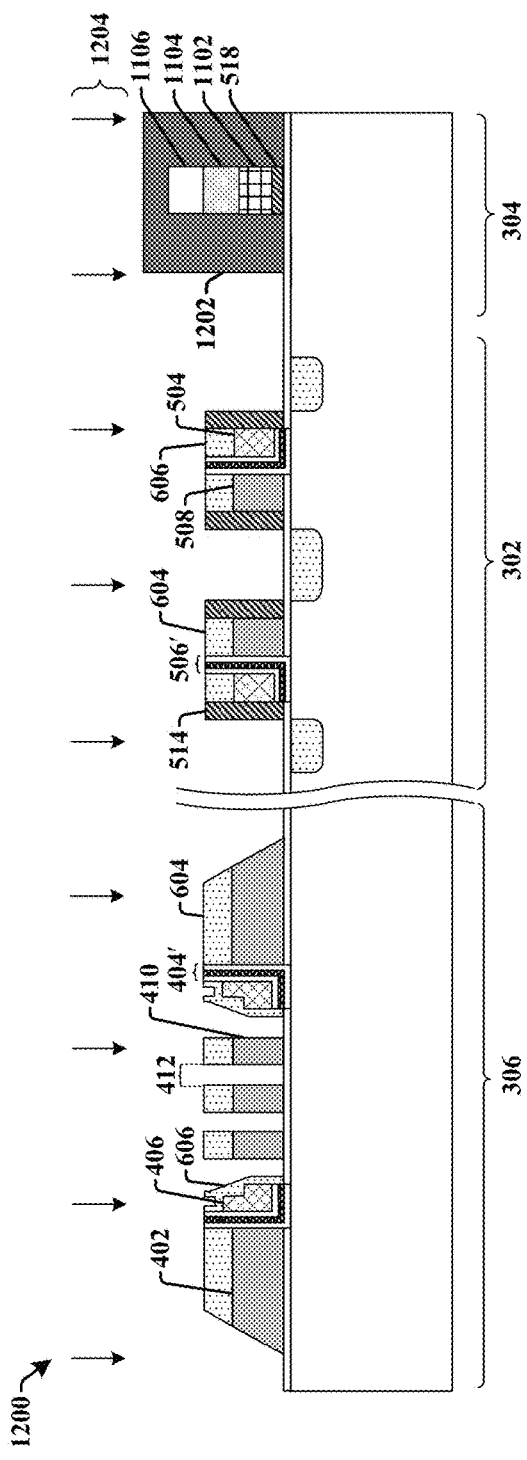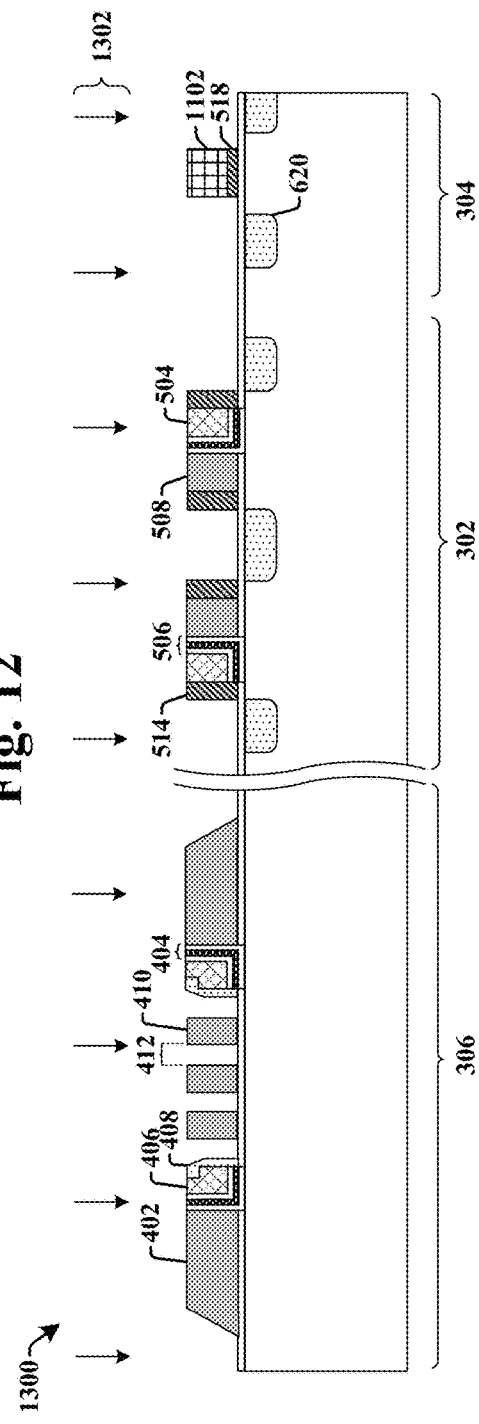

TEST LINE LETTER FOR EMBEDDED NON-VOLATILE MEMORY TECHNOLOGY

BACKGROUND

Modern day integrated chips comprise millions or billions of semiconductor devices formed on a semiconductor substrate (e.g., silicon substrate). Prior to packaging the semiconductor substrate, the semiconductor devices on the substrate are tested for functional defects. For example, a wafer acceptance test (WAT) is an electrical test in which a wafer prober sends electrical signal test patterns to the semiconductor devices. The electrical signal test patterns check the functionality of the semiconductor devices and identify devices that fail to meet design specifications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-16 illustrate some embodiments of cross-sectional views showing a method of forming a test line letter for an integrated chip having embedded flash memory.

DETAILED DESCRIPTION

Figure 1A:
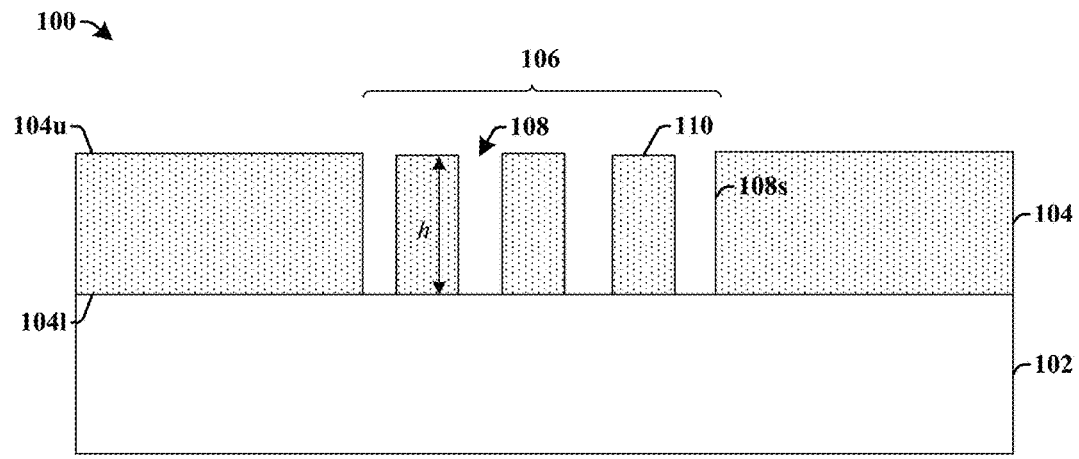
FIGS. 1A-1C illustrate some embodiments of an integrated chip comprising a test line identification character having one or more trenches arranged within a test line letter structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips often comprise conductive test lines that are configured to receive electrical test signals from a wafer prober and to provide the electrical test signals to different parts of an integrated chip to test its functionality. For example, probes of a wafer prober may physically contact a test line to provide an electrical test signal to the test line. The test line provides the electrical test signal to devices on the integrated chip, so that tests can be carried out on the devices at intermediate manufacturing stages. This allows a fabrication process to be accurately characterized so problems can be quickly identified and resolved. It also allows defective wafers to be discarded early in the fabrication process to help improve fabrication throughput.

Test line letters (e.g., alpha numeric characters) may be arranged on a substrate and used to identify test lines. In embedded systems, test line letters protruding outward from a substrate as a positive relief may be formed prior to high-k metal gate processes used to form high-k metal gate transistors. To protect the test line letters from the high-k metal gate processes, a protectant layer may be formed over the test line letters. However, it has been appreciated that such test line letters have a topography that may cause the protectant layer to collect unwanted residue from the high-k metal gate processes. When such residue is removed in a subsequent processing tool (e.g., in a chemical mechanical polishing tool), the residue may contaminate the processing tool, damaging wafers using the processing tool but not using the high-k metal gate process.

In some embodiments, the present disclosure relates to a substrate having test line letters that are used to identify a test line on an integrated chip, while avoiding contamination of high-k metal gate processes, and a method of formation. In some embodiments, the substrate comprises a semiconductor substrate. A test line letter structure is arranged over the semiconductor substrate and has one or more trenches vertically extending between an upper surface of the test letter structure and a lower surface of the test line letter structure. The one or more trenches are arranged within the test line letter structure to form an opening in the upper surface of the test line structure that has a shape of an alpha-numeric character. By defining the test line letter by the trenches, rather than by a positive relief (i.e., bumps), a topography of a protectant layer overlying the test line letter structure can be made more uniform and contamination by high-k metal gate processes can be avoided.

FIG. 1A illustrates a cross-sectional view of some embodiments of an integrated chip 100 comprising a test line identification character having one or more trenches arranged within a test line letter structure.

The integrated chip 100 comprises a semiconductor substrate 102. A test line letter structure 104 is arranged over the semiconductor substrate 102. The test line letter structure 104 comprises one or more trenches 108 vertically extending between an upper surface 104u of the test line letter structure 104 and a lower surface 104l of the test line letter structure 104. The arrangement of the one or more trenches 108 defines an opening within the test line letter structure 104 in the shape of the test line identification character 106 (e.g., in the shape of an alpha-numeric character). In other words, the one or more trenches 108 are arranged in a pattern that horizontally forms a test line identification character 106 when viewed from a top-view (shown in FIG. 1B).

In some embodiments, a plurality of dummy structures 110 are located between sidewalls 108s of the one or more trenches 108, so that the plurality of dummy structures 110 are arranged within an outer boundary of the test line identification character 106. In some embodiments, the dummy structures 110 may have a height h that is substantially equal to a height of the test line letter structure 104.

During fabrication, the dummy structures 110 allow a protectant layer (used to protect the test line identification character while processing other areas of an integrated chip) overlying the test line letter structure 104 to have a relatively even topography. This is because a small size of the openings of the one or more trenches 108 prevents large recesses from forming in a top surface of the protectant layer. When the protectant layer is subsequently etched, it will not form recesses in the test line letter structure 104 that can trap residue from high-k metal gate processes (e.g., a high-k dielectric and/or a metal gate material), thereby mitigating high-k contamination.

Figure 1B:
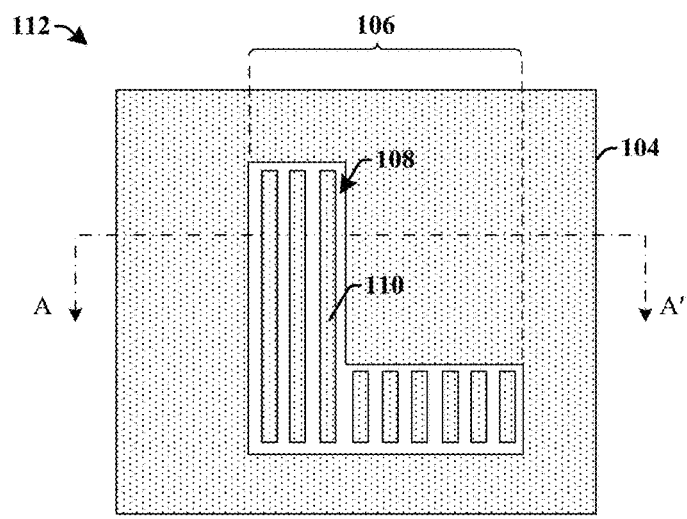

FIG. 1B illustrates a top-view 112 of some embodiments of the integrated chip of FIG. 1A, comprising a test line identification character.

As shown in top-view 112, the integrated chip comprises a test line identification character 106 arranged within a test line letter structure 104. The test line identification character 106 comprises one or more trenches 108 extending into the test line letter structure 104 so as to form an opening in an upper surface of the test line letter structure 104 that has a shape of the test line identification character 106. The test line identification character 106 is configured to have a shape that allows for a corresponding test line to be optically identified by a wafer prober. In some embodiments, the test line identification character 106 may comprise a test line letter having a shape of an alpha-numeric character. For example, the test line identification character 106 may comprise a letter such as a 'T', an 'L', or an 'X.', or a number such as "1" or "2." In some embodiments, the test line identification character 106 may comprise a character that has substantially perpendicular segments.

A plurality of dummy structures 110 are arranged within the test line identification character 106 at a location between sidewalls of the one or more trenches 108 (i.e., within an outer boundary of the test line identification character 106). In some embodiments, the plurality of dummy structures 110 may comprise elongate shapes extending along a greater length in a first horizontal direction than in a second horizontal direction. In some embodiments, the plurality of dummy structures 110 may be evenly spaced along the second horizontal direction.

In some embodiments, the plurality of dummy structures 110 are separated from interior sidewalls 108s of the one or more trenches 108. In other embodiments, one or more of the plurality of dummy structures 110 may contact one or more interior sidewalls 108s of the one or more trenches 108. In some embodiments, the plurality of dummy structures 110 are arranged so that the one or more trenches 108 comprise a contiguous opening within the test line letter structure 104 that has a shape of the test line identification character 106. In other embodiments, the plurality of dummy structures 110 are arranged to extend between two sidewalls of the one or more trenches 108, so that more than one trench forms the test line identification character 106.

Figure 1C:
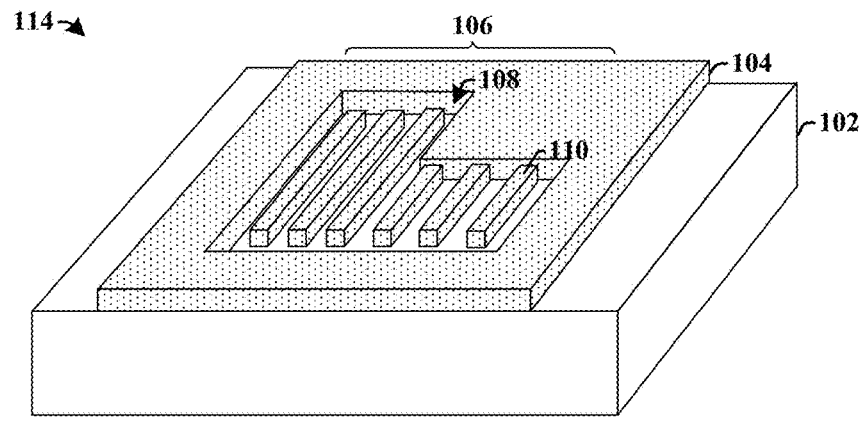

FIG. 1C illustrates a three-dimensional view 114 of some embodiments of the integrated chip of FIG. 1A, comprising a test line identification character.

Figure 2A:
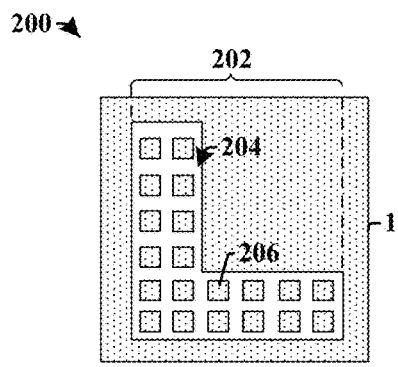
FIGS. 2A-2C illustrate top-views of some alternative embodiments of test line letters having dummy structures arranged within a test line identification character.
Figure 2B:
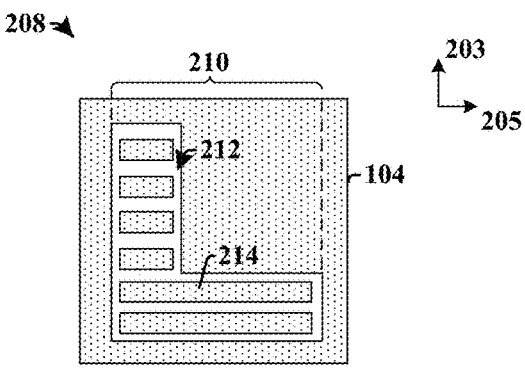
Figure 2C:
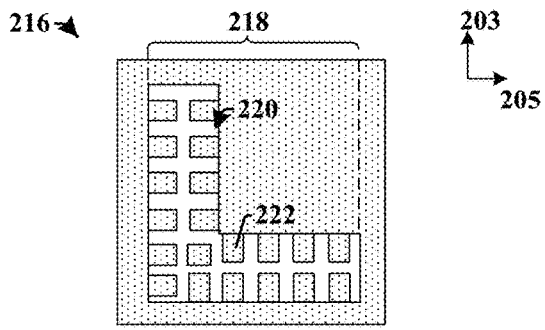

FIGS. 2A-2C illustrates top-views of some alternative embodiments of dummy structures arranged within a test line identification character comprising an alpha-numeric test line letter. Although the dummy structures are illustrated as having particular shapes, it will be appreciated that the dummy structures are not limited to the shapes shown in FIGS. 2A-2C. Rather, the dummy shapes may have different shapes (e.g., circular, triangular, etc.).

FIG. 2A shows a top-view 200 of a test line letter 202 having a plurality of square dummy structures 206. The plurality of square dummy structures 206 are arranged within a trench 204 that forms a contiguous opening in a test line letter structure 104. In some embodiments, the plurality of square dummy structures 206 may be evenly spaced along a first direction 203 and along a second direction 205 perpendicular to the first direction 203.

FIG. 2B shows a top-view 208 of a test line letter 210 having a plurality of elongated dummy structures 214. The plurality of elongated dummy structures 214 are arranged within a trench 212 that forms a contiguous opening in a test line letter structure 104. In some embodiments, the plurality of elongated dummy structures 214 extend along a greater length in a second direction 205 than in a first direction 203. In some embodiments, the plurality of elongated dummy structures 214 may be evenly spaced along the first direction 203.

FIG. 2C shows a top-view 216 of a test line letter 218 having a plurality of dummy structures 222. The plurality of dummy structures 222 are arranged within a trench 220 that forms a contiguous opening extending into a test line letter structure 104. The plurality of dummy structures 222 are in contact with sidewalls of the trench 220.

Figure 3:
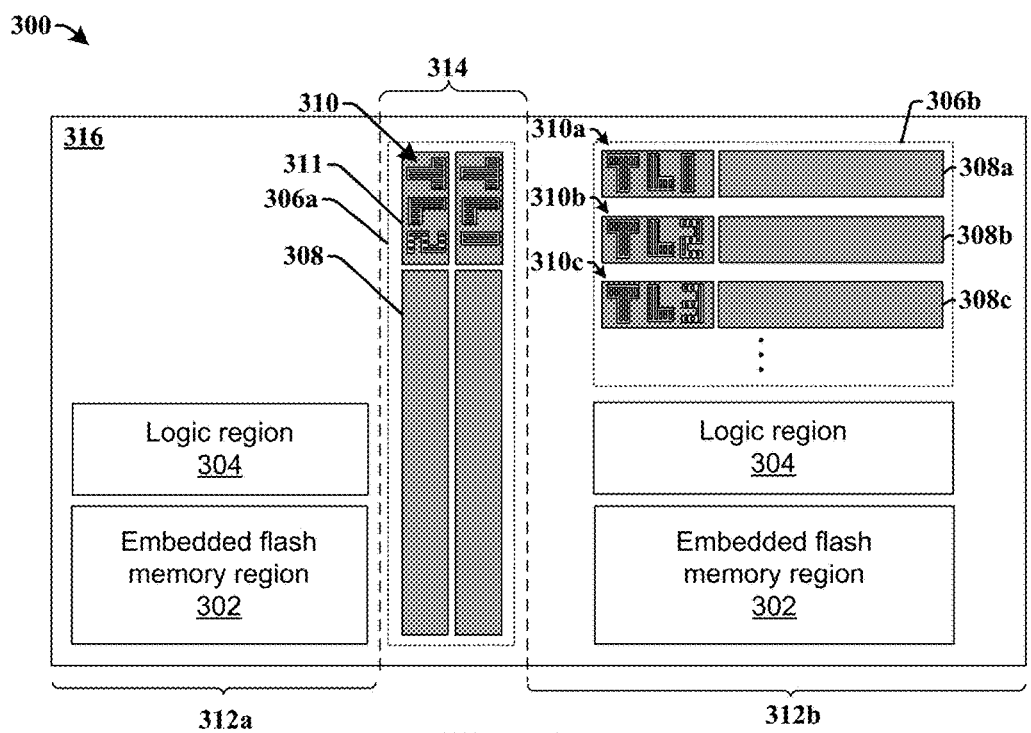
FIG. 3 illustrates a block diagram of some additional embodiments of an integrated chip having an embedded system with test line letters.

FIG. 3 illustrates a block diagram of some embodiments of an integrated chip 300 having an embedded system with test line letters.

The integrated chip 300 comprises an embedded flash memory region 302, a logic region 304, and one or more test line letter region 306a, 306b. The embedded flash memory region 302 comprises a plurality of flash memory cells. In some embodiments, the embedded flash memory cells may comprise one or more split gate flash memory cells. The logic region 304 comprises one or more transistor devices. In some embodiments, the one or more transistors devices may comprise a high-k metal gate transistor device.

The one or more test line letter regions 306a, 306b comprise a test line 308 and one or more test line letters 310 arranged within a test line letter structure 311. The test line 308 comprises a line of conductive material (e.g., copper, aluminum, tungsten. etc.) that is configured to receive an electric test signal (e.g., a sequence of electrical test signals) from a wafer prober and to convey the electric test signals to one or more devices (e.g., transistors) within the integrated chip 300. In some embodiments, the one or more test line letters 310 may be arranged within a test line letter structure 311 adjacent to a test line 308. In some embodiments, the test line letter structure 311 may be arranged closer (i.e., at a smaller distance) to an associated test line 308 than to any other conductive wiring overlying a semiconductor substrate.

In some embodiments, the one or more test line letters 310 may comprise a sequence of test line letters. For example, the sequence of test line letters may comprise a plurality of trenches that individually have a shape of a test line identification character. In some embodiments, the sequence of test line letters may comprise separate alpha-numeric characters contained within a contiguous test line letter structure 311 (i.e., the sequence of test line letters are separated from one another by the contiguous test line letter structure 311).

The one or more test line letters 310 are configured to optically identify a corresponding test line 308. For example, a first set of test line letters 310a ("TL1") may be arranged next to a first test line 308a, a second set of test line letters 310b ("TL2") may be arranged next to a second test line 308b, and a third set of test line letters 310c ("TL3") may be arranged next to a third test line 308c. The first set of test line letters 310a ("TL1") are configured to identify the first test line 308a, the second set of test line letters 310b ("TL2") are configured to identify the second test line 308b, and the third set of test line letters 310c ("TL3") are configured to identify the third test line 308c. In some embodiments, different ones of the test lines 308 may be used to perform different tests on the integrated chip 300. For example, one or more of the test lines 308a-308c may be used to perform a wafer acceptance test (WAT), while a different one or more of the test lines 308a-308c may be used as a monitor pad.

In some embodiments, the test line letter region 306a may be located within a scribe line 314 arranged between die, 312a and 312b, on a semiconductor wafer. The scribe line 314 is removed during dicing of the semiconductor substrate 316 to singulate the die, 312a and 312b. In other embodiments, the test line letter region 306b may be located within a die 312b at a location outside of a scribe line 314. In such embodiments, the test line letter region 306b is present on the die 312b after singulation (i.e., dicing) is completed. In yet other embodiments (not shown), the test line region may be integrated within any area of the integrated chip 300 (e.g., within the logic region 304, within the embedded flash memory region 302, etc.).

Figure 4:
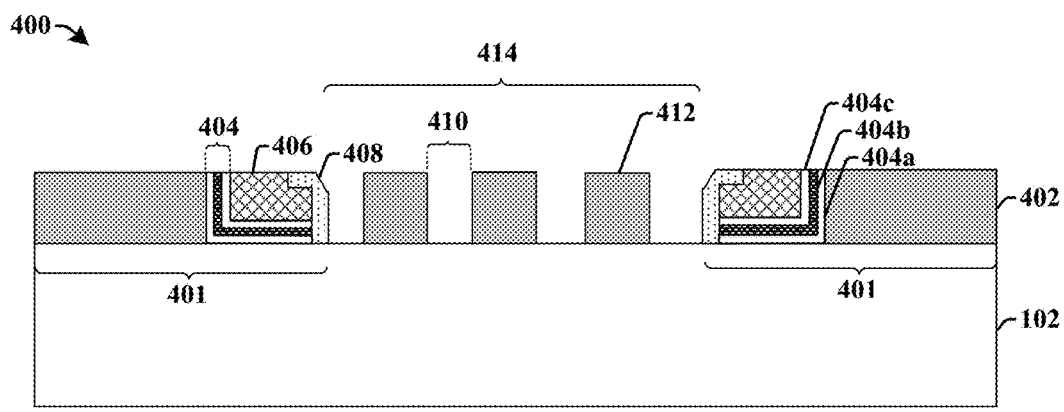
FIG. 4 illustrates a cross-sectional view of some additional embodiments of an integrated chip having a test line letter structure.

FIG. 4 illustrates a cross-sectional view of some additional embodiments of an integrated chip 400 having a test line letter structure.

The integrated chip 400 comprises a test line letter structure 401 having first polysilicon layer 402 and a second polysilicon layer 406 arranged over a semiconductor substrate 102. The first polysilicon layer 402 is laterally separated from the second polysilicon layer 406 by a tri-layer charge trapping dielectric layer 404. In some embodiments, the tri-layer charge trapping dielectric layer 404 may comprise an ONO structure having a first oxide layer 404a, a nitride layer 404b contacting the first oxide layer 404a, and a second oxide layer 404c contacting the nitride layer 404b. In other embodiments, the tri-layer charge trapping dielectric layer 404 may comprise an oxide-nano-crystal-oxide (ONCO) structure having a first oxide layer, a plurality of quantum dots contacting the first oxide layer, and a second oxide layer contacting the first oxide layer and the plurality of quantum dots.

In some embodiments, a hard mask layer 408 may be arranged along sidewalls of the second polysilicon layer 406 and a sidewall of the tri-layer charge trapping dielectric layer 404 underlying the second polysilicon layer 406. In some embodiments, the hard mask layer 408 may further abut an upper surface of the second polysilicon layer 406. In some embodiments, the hard mask layer 408 may comprise a silicon nitride (SiN) layer.

One or more trenches 410 are arranged within the test line letter structure 401. The one or more trenches 410 form an opening that has a shape of a test line letter 414. The one or more trenches 410 are laterally separated from the second polysilicon layer 406 and the tri-layer charge trapping dielectric layer 404 by the hard mask layer 408, so that the one or more trenches 410 have sidewalls extending along the hard mask layer 408.

A plurality of dummy structures 412 are arranged within test line letter 414. In some embodiments, the plurality of dummy structures 412 comprise a same material as the first polysilicon layer 402. In some embodiments, the plurality of dummy structures 412, the first polysilicon layer 402, the charge trapping dielectric layer 404 and the second polysilicon layer 406 may have substantially planar upper surfaces that are vertically aligned.

Figure 5:
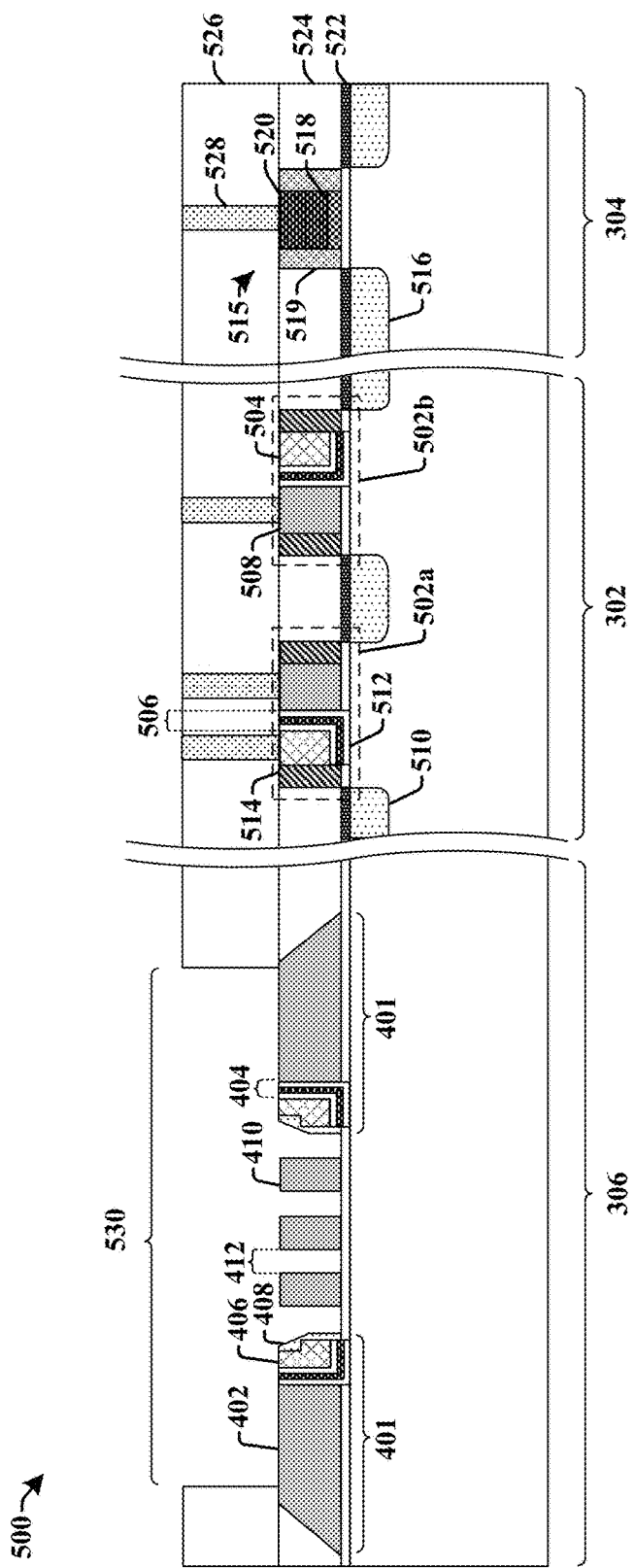
FIG. 5 illustrates a cross-sectional view of some additional embodiments of an integrated chip having a test line letter region with one or more test line letters, an embedded flash memory region, and a logic region.

FIG. 5 illustrates a cross-sectional view of some additional embodiments of an integrated chip 500. The integrated chip 500 comprises an embedded flash memory region 302, a logic region 304, and a test line letter region 306 (as described in integrated chip 400).

The embedded flash memory region 302 comprises one or more split-gate flash memory cells 502a, 502b. In some embodiments, the embedded flash memory region 302a comprises a pair of split-gate flash memory cells having a first split-gate flash memory cell 502a and a second split-gate flash memory cell 502b that are mirror images of one another about an axis of symmetry. The split-gate flash memory cells 502a, 502b respectively comprise a control gate electrode 504 and a select gate electrode 508 laterally arranged between a plurality of source/drain regions 510 disposed within the semiconductor substrate 102. A gate dielectric layer 512 is arranged vertically between the semiconductor substrate 102 and the control gate electrode 504. The control gate electrode 504 is laterally separated from the select gate electrode 508 by an additional tri-layer charge trapping dielectric layer 506 (e.g., an ONO layer) having an 'L' shape comprising a lateral component and a vertical component protruding from the lateral component. The lateral component of the additional tri-layer charge trapping dielectric layer 506 vertically separates the control gate electrode 504 from the semiconductor substrate 102.

Sidewall spacers 514 are arranged along sidewalls of the control gate electrode 504 opposing the select gate electrode 508. The sidewall spacers 514 vertically extend from an upper surface of the control gate electrode 504 to the gate dielectric layer 512. In some embodiments, the sidewall spacers 514 may comprise a first sidewall spacer and a second sidewall spacer.

The logic region 304 is laterally separated from the embedded flash memory region 302. In some embodiments, one or more isolation structures (e.g., shallow trench isolation regions) may be arranged within the semiconductor substrate 102 between the embedded flash memory region 302 and the logic region 304. The logic region 304 comprises a plurality of transistor devices 515 having a gate structure laterally arranged between source/drain regions 516 located within the semiconductor substrate 102. The gate structure may comprise a high-k metal gate structure having a high-k gate dielectric layer 518 and an overlying metal gate electrode 520. Sidewall spacers 519 are arranged onto opposing sides of the gate structure.

In some embodiments, plurality of transistor devices 515 may comprise an NMOS transistor device and/or a PMOS transistor device. The NMOS transistor device comprises an NMOS metal gate electrode arranged over the high-k gate dielectric layer 518. The PMOS transistor device comprises a PMOS metal gate electrode arranged over the high-k gate dielectric layer 518 The NMOS metal gate electrode has a different work function than the PMOS metal gate electrode. In some embodiments, the high-k gate dielectric layer 518 may comprise hafnium oxide (HfO), hafnium silicon oxide (HfSiO), hafnium aluminum oxide (HfAlO), or hafnium tantalum oxide (HfTaO), for example.

A silicide layer 522 may be arranged onto the source/drain regions, 510 and 516. The silicide layer 522 laterally abuts the gate dielectric layer 512. A first inter-level dielectric (ILD) layer 524 is arranged over the silicide layer 522. In some embodiments, a contact etch stop layer (not shown) separates the silicide layer 522 from the first ILD layer 524. In some embodiments, the first ILD layer 524 may comprise a low-k dielectric layer, an ultra low-k dielectric layer, an extreme low-k dielectric layer, and/or a silicon dioxide layer. In some embodiments, the first ILD layer 524 has a planar upper surface that is vertically aligned with upper surfaces of the control gate electrode 504, the select gate electrode 508, the test line letter structure 401, and the dummy structures 412.

A second inter-layer dielectric (ILD) layer 526 is located over the first ILD layer 524. In some embodiments, the second ILD layer 526 has an opening 530 overlying the test line letter structure and/or an associated test line (not shown). In some embodiments, the second ILD layer 526 may comprise a low-k dielectric layer, an ultra low-k dielectric layer, an extreme low-k dielectric layer, and/or a silicon dioxide layer. A plurality of conductive contacts 528 comprising a conductive material extend vertically through the second ILD layer 526 to abut the silicide layer 522. In some embodiments, the plurality of conductive contacts 528 may comprise a metal such as tungsten, copper, and/or aluminum.

FIGS. 6-16 illustrate some embodiments of cross-sectional views showing a method of forming a test line letter for an integrated chip having embedded flash memory.

Figure 6:
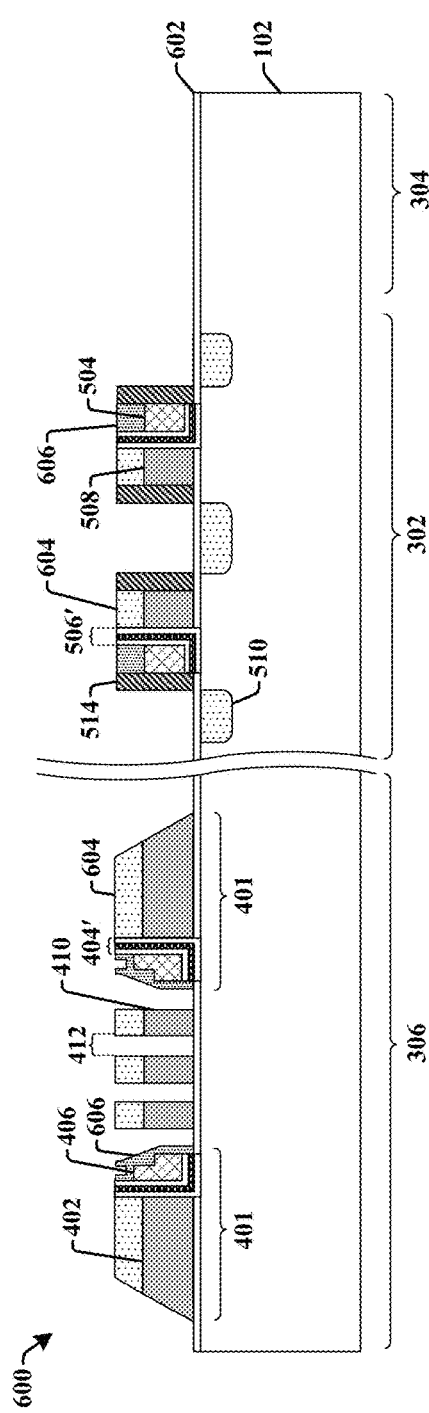

As shown in cross-sectional view 600 of FIG. 6, a gate dielectric layer 602 (e.g., SiO$_2$) is formed over a semiconductor substrate 102. In some embodiments, the gate dielectric layer 602 comprises an oxide (e.g., SiO$_2$) formed by way of a thermal process or by a deposition process (e.g., chemical vapor deposition (CVD), physical vapor deposition (PVD), atomic layer deposition (ALD), etc. In various embodiments, the semiconductor substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

A select gate layer is formed over the gate dielectric layer 602 and a first hard mask layer 604 is formed over the select gate layer. The select gate layer is then etched according to the first hard mask layer 604 to form a select gate electrode 508 of an embedded flash memory within the embedded flash memory region 302 and to concurrently form a first polysilicon layer 402 of a test line letter structure 401 and dummy structures 412 within a test line letter region 306.

Tri-layer charge trapping dielectric layers, 404' and 506', are respectively formed along sidewalls of the test line letter structure 401 and the select gate electrode 508. A control gate layer is formed onto horizontal surfaces overlying lateral segments of the tri-layer charge trapping dielectric layers, 404' and 506'. A second hard mask layer 606 is formed over the control gate layer. The control gate layer is then etched according to the second hard mask layer 606 to form a control gate electrode 504 of the embedded flash memory structure within the embedded flash memory region 302 and to concurrently form a second polysilicon layer 406 of the test line letter structure 401 within a test line letter region 306. In some embodiments, the select gate layer and a control gate layer may comprise doped polysilicon or metal formed by a deposition process (e.g., CVD, PVD, ALD, etc.). In some embodiments, the first hard mask layer 604 and the second hard mask layer 606 may comprise silicon nitride (SiN).

The test line letter structure 401 comprises one or more trenches 410 that form an opening within an upper surface of the test line letter structure 401 that is shaped like a test line identification character (e.g., an alpha-numeric character). The one or more dummy structures 412 are arranged within the opening formed by the one or more trenches 410.

In some embodiments, sidewall spacers 514 may be formed along sidewalls of the select gate electrode 508 within the embedded flash memory region 302, while the second hard mask layer 606 may be formed along sidewalls of the one or more trenches 410 in the test line letter region 306. In some embodiments, the sidewall spacers 514 may comprise a nitride. An implantation process may be performed after forming the sidewall spacers 514 to form source/drain regions 510 within the semiconductor substrate 102. The source/drain regions 510 have a higher doping concentration than the semiconductor substrate 102.

Figure 7:
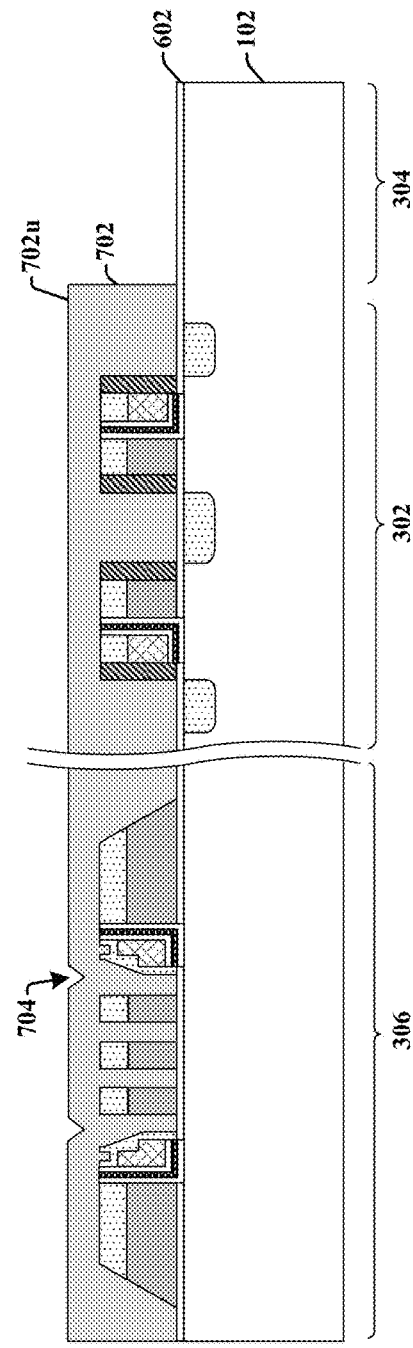

As shown in cross-sectional view 700 of FIG. 7, a protectant layer 702 is formed over the test line letter region 306 and the embedded flash memory region 302. The protectant layer 702 is configured to protect the test line letter region 306 and the embedded flash memory region 302 during subsequent processing of the logic region 304. In some embodiments, the protectant layer 702 may comprise polysilicon. The upper surface 702u of the protectant layer 702 may have one or more divots 704 located over the one or more trenches in the test line structure. However, because of the dummy structures 412, the size of the one or more divots 704 is small, so that the protectant layer 702 completely overlies the first hard mask layer 604.

As shown in cross-sectional view 800 of FIG. 8, the protectant layer 802 is exposed to a first etchant 804. The first etchant 804 is configured to etch back the protectant layer 802, so as to reduce a thickness of the protectant layer 802 overlying the semiconductor substrate 102. In various embodiments, the first etchant 804 comprises a dry etchant (e.g., a plasma etch with tetrafluoromethane (CF$_4$), sulfur hexafluoride (SF$_6$), nitrogen trifluoride (NF$_3$), etc.) or a wet etchant (e.g., hydroflouric (HF) acid).

As shown in cross-sectional view 900 of FIG. 9, the protectant layer 902 is selectively removed from over the logic region 304. In some embodiments, the protectant layer 902 may be selectively removed from over the logic region 304 by forming a first masking layer 904 over the protectant layer 902 in the test line letter region 306 and in the embedded flash memory region 302. The protectant layer 902 is subsequently exposed to a second etchant 906 in areas exposed by the first masking layer 904 to remove the protectant layer 902 from within the logic region 304. In some embodiments, the first masking layer 904 may comprise a photoresist layer.

As shown in cross-sectional view 1000 of FIG. 10, a high-k dielectric layer 1002, a sacrificial gate layer 1004, and a gate hard mask layer 1006 are formed over the semiconductor substrate 102. The high-k dielectric layer 1002, the sacrificial gate layer 1004, and the gate hard mask layer 1006 laterally extend from over the protectant layer 902 to a location within the logic region 304 that is laterally adjacent to the protectant layer 902. In some embodiments, the sacrificial gate layer 1004 may comprise polysilicon and the gate hard mask layer 1006 may comprise an oxide (e.g., SiO$_2$) or a nitride (e.g., SiN) formed by a deposition process.

As shown in cross-sectional view 1100 of FIG. 11, the high-k gate dielectric layer 518, the sacrificial gate layer 1102, and the gate hard mask layer 1104 are patterned to define a sacrificial gate stack 1108 within the logic region 304. In some embodiments, the gate hard mask layer 1104 is patterned according to an overlying masking layer 1106 (e.g., a photoresist layer). The high-k gate dielectric layer 518 and the sacrificial gate layer 1102 are subsequently exposed to a third etchant 1110 in areas not covered by the gate hard mask layer 1104.

As shown in cross-sectional view 1200 of FIG. 12, the protectant layer (902 of FIG. 11) is removed. In some embodiments, a third masking layer 1202 is formed over the logic region 304 and the protectant layer is exposed to a fourth etchant 1204. The fourth etchant 1204 removes the protectant layer within the embedded flash memory region 302 and in the test line letter region 306. In some embodiments, the third masking layer 1202 may comprise photoresist.

As shown in cross-sectional view 1300 of FIG. 13, the first hard mask layer (604 of FIG. 6), the second hard mask layer (606 of FIG. 6), and the gate hard mask layer (1104 of FIG. 11) are removed. In some embodiments, the hard mask layers may be removed by exposing the hard mask layers to a fifth etchant 1302. Source/drain regions 620 may be subsequently formed within the logic region 304. The source/drain regions 620 may be formed by an implantation process that selectively implants the semiconductor substrate 102 with a dopant species, such as boron (B) or phosphorous (P), for example. The dopant species may be subsequently driven into the semiconductor substrate 102.

Figure 14:
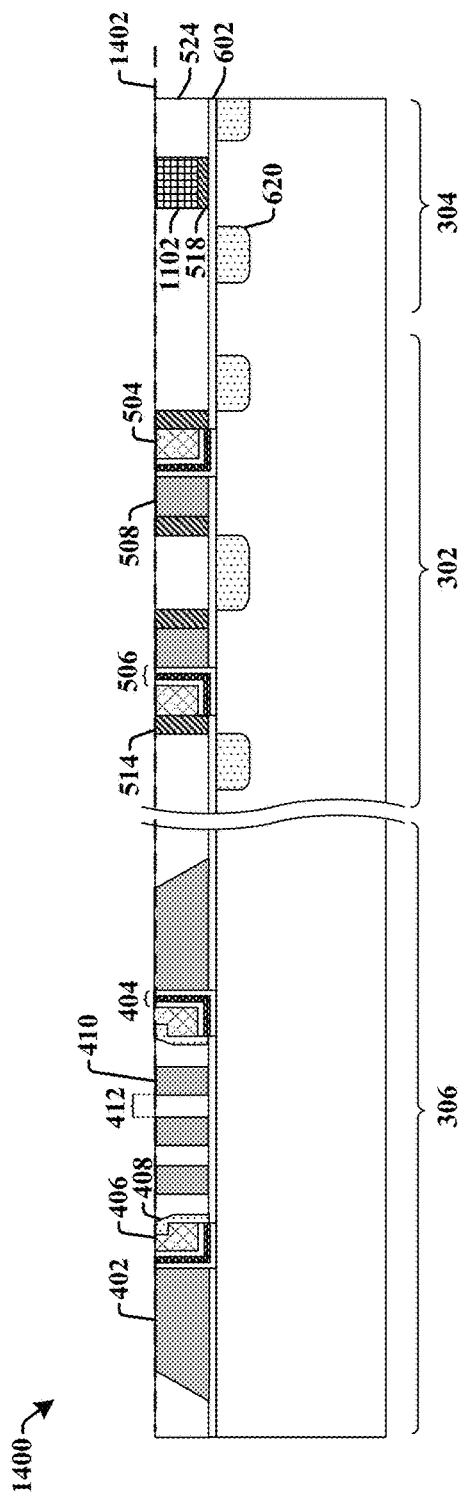

As shown in cross-sectional view 1400 of FIG. 14, a first inter-level dielectric (ILD) layer 524 is formed over the semiconductor substrate 102. In some embodiments, the first ILD layer 524 may comprise a low-k dielectric layer, formed by way of a deposition process (e.g., CVD, PVD, etc.). A planarization process may be subsequently performed (along line 1402) to remove part of the first ILD layer 524 and to expose an upper surface of the sacrificial gate layer 1102.

Figure 15:
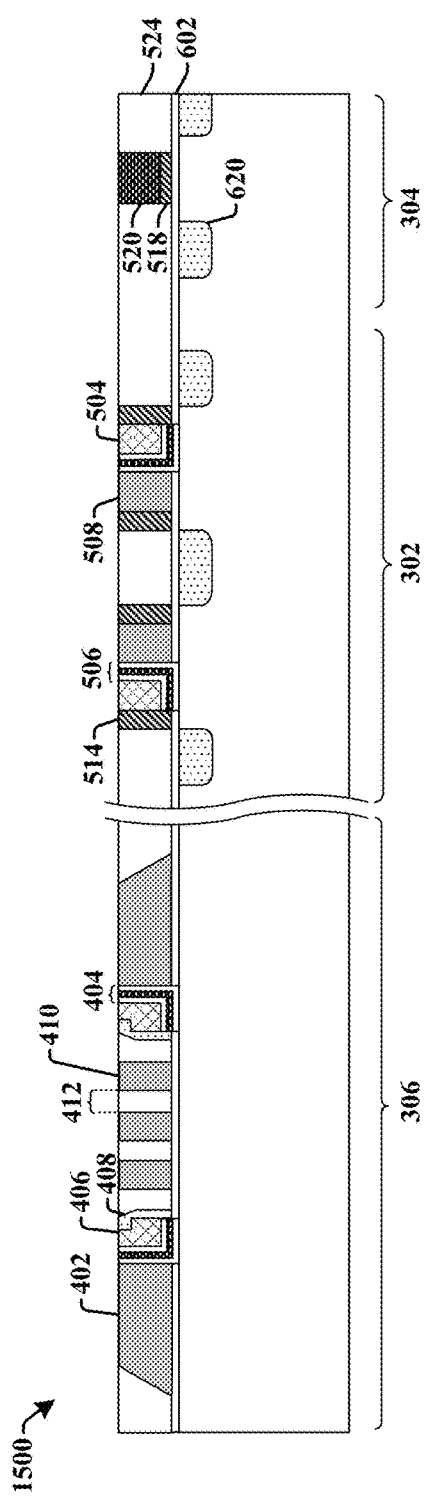

As shown in cross-sectional view 1500 of FIG. 15 a replacement gate process is performed. The replacement gate process removes the sacrificial gate layer 1102 and forms a metal gate electrode 520 over the high-k gate dielectric layer 518 using a deposition technique. In some embodiments, the metal gate electrode 520 may comprise an NMOS metal gate electrode, while in other embodiments the metal gate electrode 520 may comprise a PMOS metal gate electrode having a different work function than the NMOS metal gate electrode.

Figure 16:
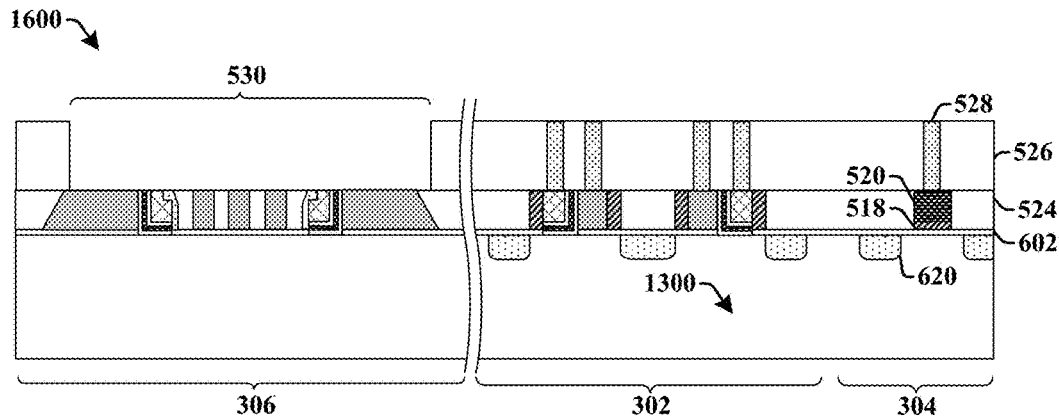

As shown in cross-sectional view 1600 of FIG. 16, conductive contacts 528 are formed within a second inter-layer dielectric (ILD) layer 526 overlying the first ILD layer 524. The conductive contacts 528 may be formed by selectively etching the second ILD layer 526 to form openings, and by subsequently depositing a conductive material within the openings. In some embodiments, the conductive material may comprise tungsten (W) or titanium nitride (TiN), for example. In some embodiments, the second ILD layer 526 may be etched to form an opening 530 overlying the test line letter structure or an associated test line.

Figure 17:
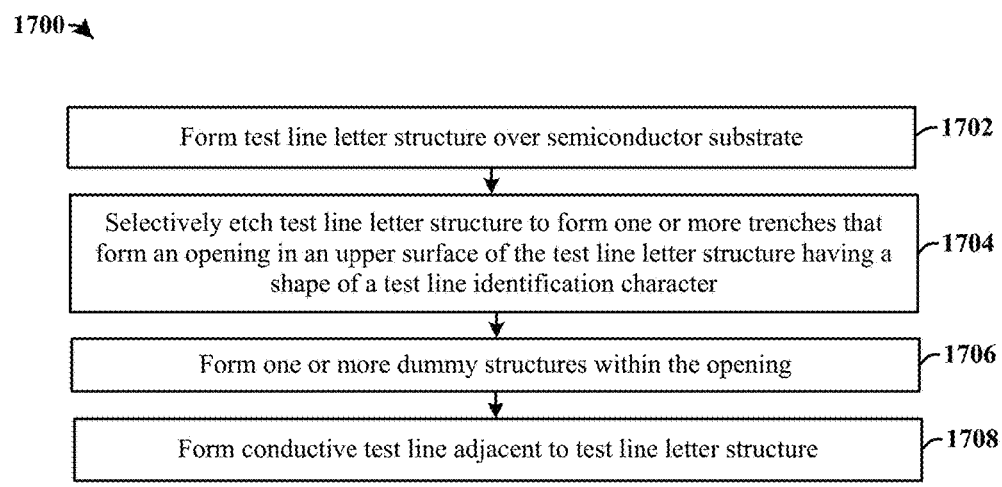
FIG. 17 illustrates a flow diagram of some embodiments of a method of forming a test line letter having trenches arranged within a test line identification character.

FIG. 17 illustrates a flow diagram of some embodiments of a method 1700 of forming a test line letter having trenches arranged within a test line identification character.

While the disclosed methods (e.g., methods 1700 and 1800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a test line letter structure is formed over a semiconductor substrate.

At 1704, the test line letter structure is selectively etched. Selectively etching the test line letter structure forms one or more trenches that vertically extend into the test line structure and that form an opening in an upper surface of the test line letter structure that has a shape of a test line identification character.

At 1706, one or more dummy structures are formed within the opening. In some embodiments, the one or more dummy structures may be concurrently formed with the formation of the one or more trenches (e.g., by a same etching process).

At 1708, a conductive test line is formed adjacent to test line letter structure. In some embodiments, the test line identification character may be arranged closer (i.e., at a smaller distance) to the conductive test line than to any other conductive wiring overlying the semiconductor substrate.

Figure 18:
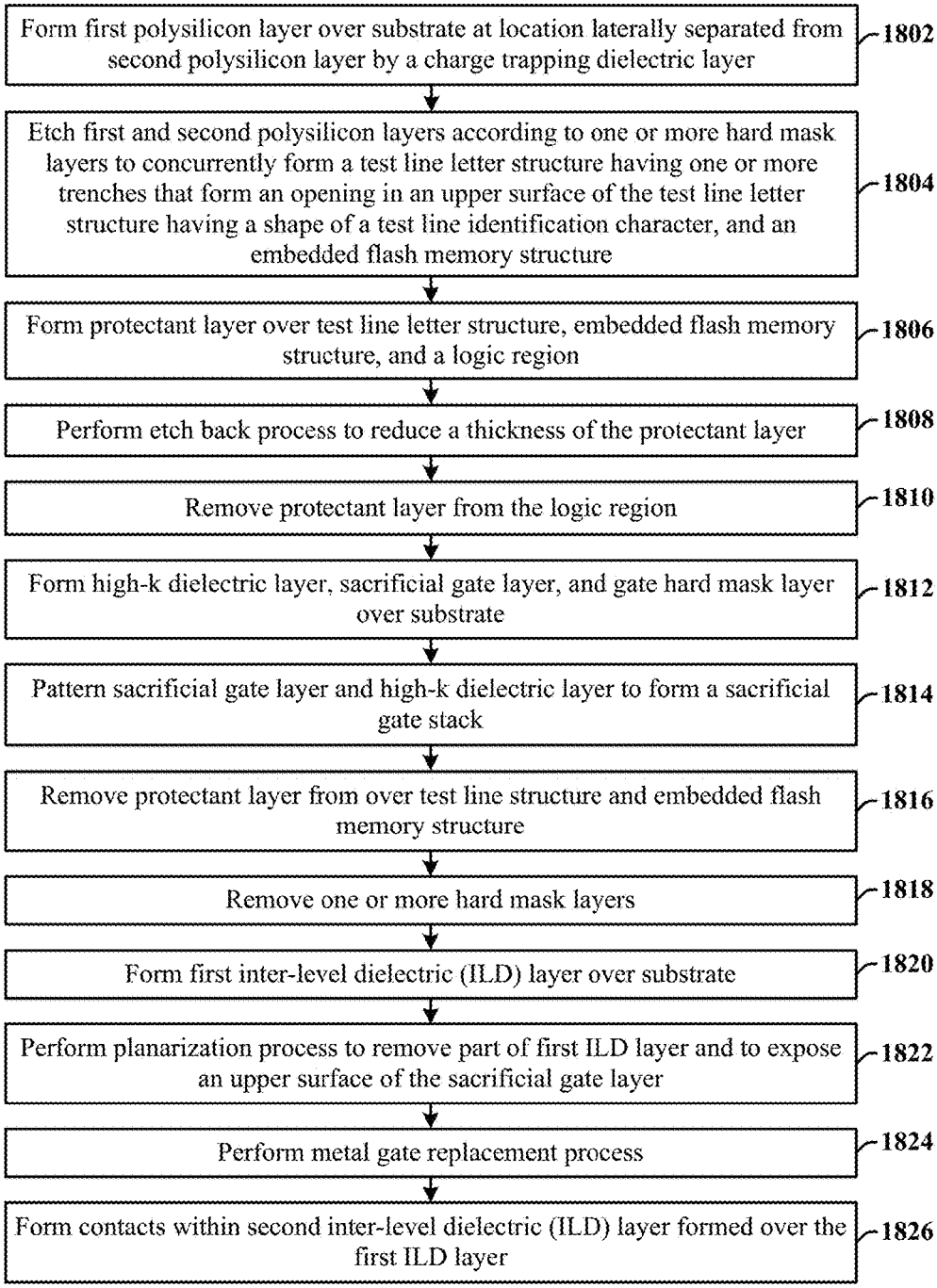
FIG. 18 illustrates a flow diagram of some additional embodiments of a method of forming a test line letter for an integrated chip having embedded flash memory.

FIG. 18 illustrates some additional embodiments of a method 1800 of forming a test line letter for an integrated chip having embedded flash memory. Although method 1800 is described in relation to FIGS. 6-16, it will be appreciated that the method 1800 is not limited to such structures, but instead may stand alone as a method independent of the structures.

At 1802, a first polysilicon layer is formed over a substrate. The first polysilicon layer is laterally separated from a second polysilicon layer by a charge trapping dielectric layer. FIG. 6 illustrates some embodiments of a cross-sectional view 600 corresponding to act 1802.

At 1804, the first and second polysilicon layers are etched according to one or more hard mask layers to concurrently form a test line letter structure and an embedded flash memory structure. The test line letter structure comprises one or more trenches vertically extending into the test line letter structure, which has a first polysilicon layer and an overlying first hard mask layer. The one or more trenches form an opening in an upper surface of the test line letter structure having a shape of a test line identification character and horizontally having a shape of an alpha numeric character. FIG. 6 illustrates some embodiments of a cross-sectional view 600 corresponding to act 1804.

At 1806, a protectant layer is formed over the test line letter structure, the embedded flash memory structure, and a logic region. FIG. 7 illustrates some embodiments of a cross-sectional view 700 corresponding to act 1806.

At 1808, an etch back process is performed to reduce a thickness of the protectant layer over the substrate. FIG. 8 illustrates some embodiments of a cross-sectional view 800 corresponding to act 1808.

At 1810, the protectant layer is removed from the logic region. FIG. 9 illustrates some embodiments of a cross-sectional view 900 corresponding to act 1810.

At 1812, a high-k dielectric layer, a sacrificial gate layer, and a gate hard mask layer are sequentially formed over the substrate. FIG. 10 illustrates some embodiments of a cross-sectional view 1000 corresponding to act 1812.

At 1814, the sacrificial gate layer and the high-k dielectric layer are patterned to form a sacrificial gate stack. FIG. 11 illustrates some embodiments of a cross-sectional view 1100 corresponding to act 1814.

At 1816, the protectant layer is removed from over test line structure and embedded flash memory structure. FIG. 12 illustrates some embodiments of a cross-sectional view 1200 corresponding to act 1816.

At 1818, the one or more hard mask layers are removed. FIG. 13 illustrates some embodiments of a cross-sectional view 1300 corresponding to act 1818.

At 1820, a first inter-level dielectric (ILD) layer is deposited over the substrate. The first ILD layer is located laterally between the sacrificial gate stack and the embedded flash memory structure. FIG. 14 illustrates some embodiments of a cross-sectional view 1400 corresponding to act 1820.

At 1822, a planarization process is performed to remove part of the first ILD layer and to expose an upper surface of the sacrificial gate layer. FIG. 14 illustrates some embodiments of a cross-sectional view 1400 corresponding to act 1822.

At 1824, a metal gate replacement process is performed. The metal gate replacement process replaces the sacrificial gate layer with a metal gate electrode. FIG. 15 illustrates some embodiments of a cross-sectional view 1500 corresponding to act 1824.

At 1826, contacts are formed within a second inter-level dielectric (ILD) layer formed over the first ILD layer. FIG. 16 illustrates some embodiments of a cross-sectional view 1600 corresponding to act 1826.

Therefore, the present disclosure relates to a substrate having test line letters comprising trenches within a test line letter structure, which are used to identify a test line on an integrated chip, and a method of formation.

In some embodiments, the present disclosure relates to an integrated chip. The integrated chip comprises a semiconductor substrate. A test line letter structure is arranged over the semiconductor substrate and has one or more trenches vertically extending between an upper surface of the test line letter structure and a lower surface of the test line letter structure. The one or more trenches are arranged within the test line letter structure to form an opening in the upper surface of the test line structure that has a shape of an alpha-numeric character.

In other embodiments, the present disclosure relates to an integrated chip. The integrated chip comprises a test line letter structure arranged over a semiconductor substrate and having one or more trenches vertically extending between an upper surface of the test line letter structure and a lower surface of the test line letter structure. The one or more trenches are arranged to form an opening in the upper surface of the test line letter structure that has a shape of a test line identification character. One or more dummy structures are arranged within the identification. A conductive test line arranged over the semiconductor substrate at a location that is adjacent to the test line letter structure. The conductive test line is configured to receive an electrical test signal from a wafer prober In yet other embodiments, the present disclosure relates to a method of forming an integrated chip. The method comprises forming a test line letter structure over a semiconductor substrate. The method further comprises performing an etching process to selectively etch the test line letter structure to form one or more trenches vertically extending into the test line letter structure, wherein the one or more trenches form an opening within an upper surface of the test line letter structure that has a shape of a test line identification character. The method further comprises forming a conductive test line over the semiconductor substrate at a location that is adjacent to the test line letter structure, wherein the conductive test line is configured to receive an electrical test signal from a wafer prober.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a semiconductor substrate;
   a test line letter structure arranged over the semiconductor substrate and having one or more trenches defined by sidewalls of the test line letter structure, wherein the sidewalls vertically extend between an upper surface of the test line letter structure and a lowermost surface of the test line letter structure facing the semiconductor substrate;
   wherein the one or more trenches are arranged within the test line letter structure to define an opening in the upper surface of the test line letter structure that has a shape of an alpha-numeric character, and wherein the opening is bound by the test line letter structure on opposing sides along a first direction and on opposing sides along a second direction substantially perpendicular to the first direction;
   wherein the test line letter structure comprises:
     a first polysilicon layer arranged over the semiconductor substrate;
     a second polysilicon layer arranged over the semiconductor substrate and having segments arranged on opposing sides of the opening; and
     a dielectric layer arranged laterally between the first polysilicon layer and the second polysilicon layer, and arranged vertically between the second polysilicon layer and the semiconductor substrate.

2. The integrated chip of claim 1, wherein the one or more trenches form a contiguous opening within the test line letter structure that has the shape of the alpha-numeric character.

3. The integrated chip of claim 2, further comprising:
   one or more dummy structures arranged within the contiguous opening and having a height that is substantially equal to a height of the test line letter structure.

4. The integrated chip of claim 3, wherein the one or more dummy structures comprise a same material as the test line letter structure.

5. The integrated chip of claim 3, wherein the one or more dummy structures are laterally separated from the sidewalls of the test line letter structure.

6. The integrated chip of claim 1, further comprising:
   a high-k metal gate transistor arranged within the semiconductor substrate at a location that is separated from the test line letter structure, wherein the high-k metal gate transistor comprises a high-k metal gate structure vertically overlying the semiconductor substrate and laterally arranged between source and drain regions located within the semiconductor substrate,
wherein the high-k metal gate structure comprises a high-k dielectric layer and an overlying metal gate electrode.

7. The integrated chip of claim 1,
wherein the second polysilicon layer comprises a first upper surface and a second upper surface facing away from the semiconductor substrate, and wherein the first upper surface is above the second upper surface; and
wherein the dielectric layer comprises a tri-layer charge trapping dielectric layer arranged laterally between the first polysilicon layer and the second polysilicon layer, and arranged vertically between the second polysilicon layer and the semiconductor substrate.

8. The integrated chip of claim 7, further comprising:
a split-gate flash memory cell arranged at a location that is separated from the test line letter structure, wherein the split-gate flash memory cell comprises a select gate electrode vertically separated from the semiconductor substrate by a gate dielectric layer and laterally separated from a control gate electrode by an additional tri-layer charge trapping dielectric layer; and
wherein the control gate electrode has a different cross-sectional shape than the segments of the second polysilicon layer.

9. The integrated chip of claim 8, wherein the first polysilicon layer and the select gate electrode comprise a same first material, and the second polysilicon layer and the control gate electrode comprise a same second material.

10. The integrated chip of claim 8, wherein the select gate electrode, the control gate electrode, the first polysilicon layer, and the second polysilicon layer have upper surfaces that are vertically aligned.

11. The integrated chip of claim 1, further comprising:
a hard mask layer arranged over the semiconductor substrate at a location that laterally separates the one or more trenches from the second polysilicon layer and the dielectric layer; and
wherein the hard mask layer has an uppermost surface that is laterally separated from the dielectric layer by the second polysilicon layer.

12. The integrated chip of claim 1, wherein the first polysilicon layer and the second polysilicon layer vertically extend to a horizontal plane extending along an uppermost surface of the dielectric layer.

13. The integrated chip of claim 1, wherein the opening is filled with a dielectric material.

14. An integrated chip, comprising:
a test line letter structure arranged over a semiconductor substrate and having one or more trenches vertically extending between an upper surface of the test line letter structure and a lower surface of the test line letter structure, wherein the one or more trenches are arranged to form an opening in the upper surface of the test line letter structure that has a shape of a test line identification character;
one or more dummy structures arranged within the opening;
wherein the test line letter structure comprises:
a first polysilicon layer arranged over the semiconductor substrate;
a second polysilicon layer arranged over the semiconductor substrate;
a dielectric layer laterally between the first polysilicon layer and the second polysilicon layer and vertically between the second polysilicon layer and the semiconductor substrate; and
a hard mask layer disposed along a sidewall of the second polysilicon layer, wherein outermost sidewalls of the hard mask layer facing away from the second polysilicon layer extend completely around the opening along an unbroken path.

15. The integrated chip of claim 14, wherein the second polysilicon layer comprises a first upper surface and a second upper surface facing away from the semiconductor substrate, and wherein the first upper surface is above the second upper surface.

16. The integrated chip of claim 14, wherein the hard mask layer has an uppermost surface that is laterally separated from the dielectric layer by the second polysilicon layer.

17. The integrated chip of claim 14, wherein the shape of the opening is an English letter or number.

18. An integrated chip, comprising:
a test line letter structure arranged over a substrate and comprising:
a first layer arranged over the substrate;
a second layer arranged over the substrate and having segments laterally offset from the first layer, wherein the segments comprise a first upper surface and a second upper surface facing away from the substrate, wherein the first upper surface is above the second upper surface;
a tri-layer charge trapping dielectric layer arranged laterally between the first layer and the second layer, and arranged vertically between the second layer and the substrate; and
one or more trenches vertically extending between an upper surface and a lower surface of the first layer, wherein the one or more trenches comprise sidewalls that define an opening that has a shape of an alphanumeric character when viewed from a top view.

19. The integrated chip of claim 18, further comprising:
a split-gate flash memory cell arranged over the substrate, wherein the split-gate flash memory cell comprises a select gate electrode vertically separated from the substrate by a gate dielectric layer and laterally separated from a control gate electrode by an additional tri-layer charge trapping dielectric layer; and
wherein the first layer and the select gate electrode comprise a same first material, and the second layer and the control gate electrode comprise a same second material.

20. The integrated chip of claim 19, wherein the segments of the second layer are laterally separated by a hard mask layer.

* * * * *